(12) United States Patent
Niu et al.

(10) Patent No.: US 11,022,796 B2
(45) Date of Patent: Jun. 1, 2021

(54) VIRTUAL REALITY DISPLAY DEVICE

(71) Applicant: Shanghai SEEO Optronics Technology Co., Ltd., Shanghai (CN)

(72) Inventors: Lei Niu, Shanghai (CN); Bo Liu, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 0 days.

(21) Appl. No.: 16/728,222

(22) Filed: Dec. 27, 2019

(65) Prior Publication Data

US 2020/0132994 A1 Apr. 30, 2020

Related U.S. Application Data

(63) Continuation-in-part of application No. PCT/CN2018/096548, filed on Jul. 21, 2018.

(30) Foreign Application Priority Data

Jul. 16, 2018 (CN) .......................... 201810774158.2

(51) Int. Cl.
*G02B 27/01* (2006.01)
*H01L 51/52* (2006.01)

(52) U.S. Cl.
CPC ...... *G02B 27/0101* (2013.01); *H01L 51/5271* (2013.01); *H01L 51/5293* (2013.01)

(58) Field of Classification Search
CPC ............ G02B 27/0101; H01L 51/5271; H01L 51/5293
See application file for complete search history.

(56) References Cited

U.S. PATENT DOCUMENTS

| 10,445,860 | B2 * | 10/2019 | Fix | G06K 9/00604 |
| 2002/0167645 | A1 * | 11/2002 | Johnson | B41J 2/435 |
| | | | | 353/20 |
| 2004/0145703 | A1 * | 7/2004 | O'Connor | G03B 33/08 |
| | | | | 353/20 |
| 2010/0238546 | A1 * | 9/2010 | Hsu | G02B 30/25 |
| | | | | 359/465 |
| 2010/0320401 | A1 * | 12/2010 | Tsukihara | H01L 21/268 |
| | | | | 250/492.1 |

(Continued)

FOREIGN PATENT DOCUMENTS

| CN | 104903777 A | 9/2015 |
| CN | 107422480 A | 12/2017 |

(Continued)

OTHER PUBLICATIONS

Int'l. Search Report for PCT/CN2018/096548, dated Mar. 27, 2019.

*Primary Examiner* — Sejoon Ahn
(74) *Attorney, Agent, or Firm* — Blue Filament Law PLLC (57) ABSTRACT

The present disclosure provides a virtual reality display device including an OLED display panel and an optical system. The optical system is disposed between the OLED display panel and a user viewing side. The optical system includes a first linear polarizing sheet disposed between the OLED display panel and the user viewing side, a first reflective-transmissive optical film disposed between the first linear polarizing sheet and the OLED display panel, and a first quarter-wave plate disposed between the first reflective-transmissive optical film and the OLED display panel.

16 Claims, 6 Drawing Sheets

(56) References Cited

U.S. PATENT DOCUMENTS

| | | | | |
|---|---|---|---|---|
| 2013/0038811 A1* | 2/2013 | Sugita | .................... | G02B 30/25 |
| | | | | 349/61 |
| 2014/0177063 A1* | 6/2014 | Wang | ....................... | G02B 5/30 |
| | | | | 359/630 |
| 2015/0138457 A1* | 5/2015 | Kroon | .................... | G02B 30/25 |
| | | | | 349/15 |
| 2017/0220838 A1* | 8/2017 | He | ........................ | G06F 3/0412 |
| 2018/0039052 A1 | 2/2018 | Khan et al. | | |
| 2018/0313981 A1* | 11/2018 | Cobb | ................. | G02B 27/0101 |

FOREIGN PATENT DOCUMENTS

| | | | |
|---|---|---|---|
| CN | 1080020920 A | 5/2018 | |
| CN | 108227209 A | 6/2018 | |
| WO | 2017136042 A1 | 8/2017 | |

\* cited by examiner

VIRTUAL REALITY DISPLAY DEVICE

RELATED APPLICATIONS

This application is a continuation in part of PCT Application Serial Number PCT/CN2018/096548 filed Jul. 21, 2018 that in turn claims priority of Chinese Application Number 201810774158.2 filed Jul. 16, 2018; the contents of which are hereby incorporated by reference.

TECHNICAL FIELD

The present disclosure relates to the field of display technology, and in particular, to a virtual reality display device.

BACKGROUND

VR (Virtual Reality) display was proposed in the 1980s by the founder, Jaron Lanier, of American VPL Company. It integrates various scientific technologies such as computer graphics technology, computer simulation technology, sensor technology, display technology and the like, and it creates a virtual information environment in a multidimensional information space, which can provide an immersive experience to users, has an ability to interact with an environment and helps to inspire ideas.

Figure 1:
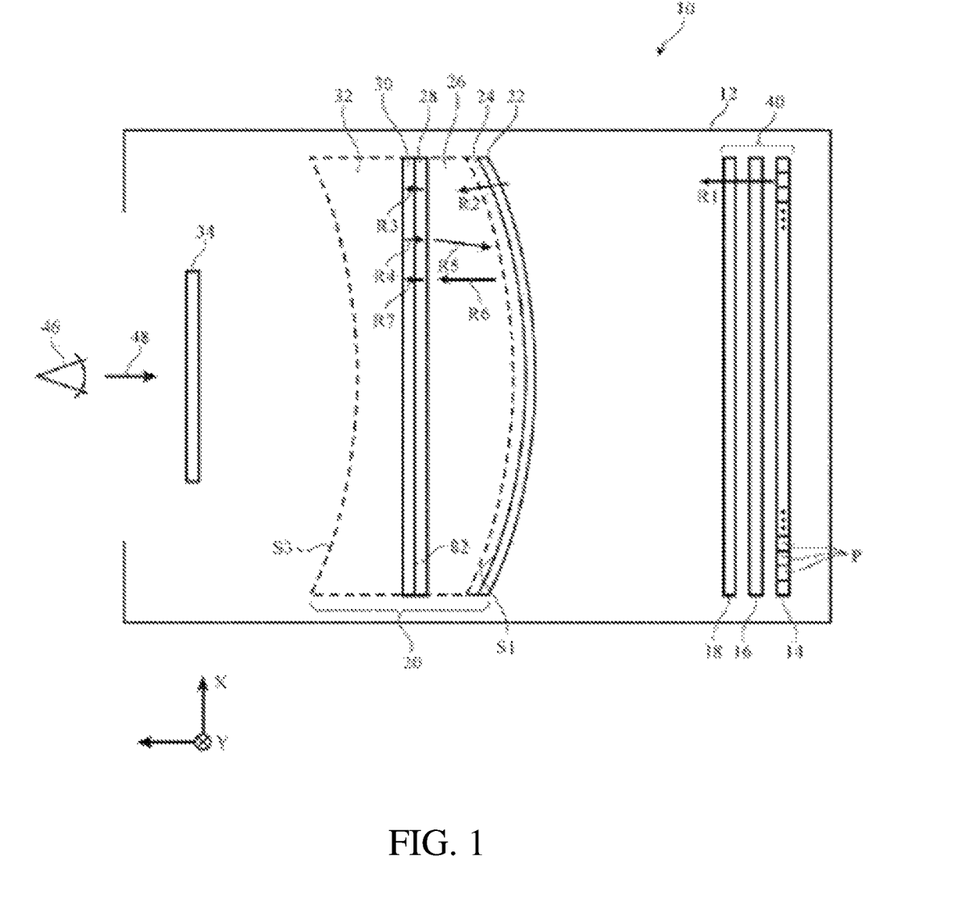
FIG. 1 is a schematic diagram of a virtual reality display device provided by the related art.

A virtual reality display device in the related art generally includes a computer processing system, an image processing system, a display panel, and an optical system. The computer processing system captures human behaviors and an external environment with external sensors and then processes them according to a corresponding scene. Then it is rendered by the image processing system and then it is output to the display panel. An image on the display panel presents an enlarged virtual image through the optical system and is received by eyes. The optical system is mainly configured to pull a near image generated by the display panel to a far distance and enlarge it to make it almost fill a human's vision field, thereby resulting in immersion. An optical system in the related art is mainly composed of various optical lenses and optical films. The optical lens and the optical films have a certain selective transmission effect on light emitted from the display panel, and this results in loss of brightness, which causes a relatively low light efficiency of the entire virtual reality display device and a relatively dark displayed image. As shown in FIG. 1, a schematic diagram of a virtual reality display device provided by a patent application with a publication No. US20180039052A1 is illustrated. In a structure shown in FIG. 1, light R1 emitted by the display device 14 losses a portion of the light when passing through a first linear polarizing sheet 16, and this portion of the light is absorbed because its vibration direction is perpendicular to a transmission axis of the first linear polarizing sheet 16, so that it cannot enter a subsequent optical system, resulting in a low optical utilization rate.

SUMMARY

The present disclosure provides a virtual reality display device, including an OLED display panel and an optical system, the optical system being disposed between the OLED display panel and a user viewing side. The optical system includes a first linear polarizing sheet disposed between the OLED display panel and the user viewing side, a first reflective-transmissive optical film disposed between the first linear polarizing sheet and the OLED display panel, and a first quarter-wave plate disposed between the first reflective-transmissive optical film and the OLED display panel.

In an embodiment, the optical system further includes one plano-convex lens and one plano-concave lens, the plano-convex lens is located at a side close to the first linear polarizing sheet, and the plano-concave lens is close to the user viewing side.

In an embodiment, the virtual reality display device further includes a second quarter-wave plate disposed between the first linear polarizing sheet and the plano-convex lens.

In an embodiment, the virtual reality display device further includes a third quarter-wave plate and a second reflective-transmissive optical film that are disposed between the plano-convex lens and the plano-concave lens.

In an embodiment, the plano-convex lens is provided with a semi-transmissive and semi-reflective film layer on a side close to the second quarter-wave plate.

In an embodiment, the virtual reality display device further includes a second linear polarizing sheet is disposed between the plano-concave lens and the user viewing side.

In an embodiment, the optical system includes a plano-convex lens, a biconvex lens and a plano-concave lens, the plano-convex lens is located at a side close to the first linear polarizing sheet, the plano-concave lens is close to the user viewing side, and the biconvex lens is located between the plano-convex lens and the plano-concave lens.

In an embodiment, the virtual reality display device further includes a second quarter-wave plate disposed between the plano-convex lens and the first linear polarizing sheet.

In an embodiment, the virtual reality display device further includes a third quarter-wave plate and a second reflective-transmissive optical film that are disposed between the plano-convex lens and the user viewing side.

In an embodiment, the virtual reality display device further includes a second linear polarizing sheet disposed between the second reflective-transmissive optical film and the user viewing side.

In an embodiment, the virtual reality display device further includes a semi-transmissive and semi-reflective film layer disposed on a side of the plano-convex lens close to the second quarter-wave plate.

In an embodiment, in natural light emitted by the OLED display panel, P-type polarized light is transmitted through the first reflective-transmissive optical film, and S-type polarized light is reflected by the first reflective-transmissive optical film to pass through the first quarter-wave plate and is reflected by the OLED display panel to be changed into the P-type polarized light.

In an embodiment, the OLED display panel is an OLED on Silicon display panel.

In an embodiment, the first reflective-transmissive optical film is a reflective polarizing sheet; or, the first reflective-transmissive optical film is a metal grating polarizer.

The present disclosure further provides a virtual reality display device, including an OLED display panel and an optical system, wherein the optical system is disposed between the OLED display panel and a user viewing side, the optical system includes a first quarter-wave plate, a first reflective-transmissive optical film, a first linear polarizing sheet, a second quarter-wave plate, a plano-convex lens, a third quarter-wave plate, a second reflective-transmissive optical film, a plano-concave lens, a second linear polarizing sheet that are sequentially disposed between the OLED display panel and the user viewing side, and a semi-transmissive and semi-reflective film layer is provided on a side of the plano-convex lens close to the second quarter-wave plate.

In an embodiment, in natural light emitted by the OLED display panel, P-type polarized light is transmitted through the first reflective-transmissive optical film, and S-type polarized light is reflected by the first reflective-transmissive optical film to pass through the first quarter-wave plate, and is reflected by the OLED display panel to be changed into P-type polarized light.

The present disclosure further provides a virtual reality display device, including an OLED display panel and an optical system, wherein the optical system is disposed between the OLED display panel and a user viewing side, the optical system includes a first quarter-wave plate, a first reflective-transmissive optical film, a first linear polarizing sheet, and a second quarter-wave plate, a plano-convex lens, a biconvex lens position, a plano-concave lens, a third quarter-wave plate, a second reflective-transmissive optical film, a second linear polarizing sheet that are sequentially disposed between the OLED display panel and the user viewing side, and a semi-transmissive and semi-reflective film layer is provided at a side of the biconvex lens close to the plano-convex lens.

In an embodiment, in natural light emitted by the OLED display panel, P-type polarized light is transmitted through the first reflective-transmissive optical film, and S-type polarized light is reflected by the first reflective-transmissive optical film to pass through the first quarter-wave plate, and is reflected by the OLED display panel to be changed into P-type polarized light.

In the present disclosure, by providing the first reflective-transmissive optical film and the first quarter-wave plate, linearly polarized light, which cannot be transmitted through the first linear polarizing sheet originally, is converted into linearly polarized light that can be transmitted through the first linear polarizing sheet, and then it enters a subsequent light system, which improves an optical utilization rate of the virtual reality display device and improves display brightness of the virtual reality display device.

DESCRIPTION OF EMBODIMENTS

Exemplary implementations will now be described more fully with reference to the accompanying drawings. However, the exemplary implementation can be implemented in many forms and should not be construed as being limited to the examples set forth herein; instead, these implementations are provided to make the present disclosure more comprehensive and complete and to fully convey concepts of the exemplary implementations to those skilled in the art.

Furthermore, the described features, structures, or characteristics can be combined in any suitable manner in one or more embodiments. In the following description, various specific details are set forth to provide a full understanding of the embodiments of the present disclosure. However, those skilled in the art should recognize that the technical solution of the present disclosure can be implemented without one or more of the specific details, or implemented with other methods, components, devices, steps, etc. In other instances, well-known methods, devices, implementations, or operations are not shown or described in detail to avoid obscuring aspects of the present disclosure.

The figures shown in the drawings are merely illustrative. It is not necessary to include all of the content and operations/steps, and it is not necessary to execute in the described order. For example, some operations/steps can also be divided, and some operations/steps can be combined, partially combined, or adjusted, so that an order of an actual execution may change according to actual conditions.

First Embodiment

Figure 2:
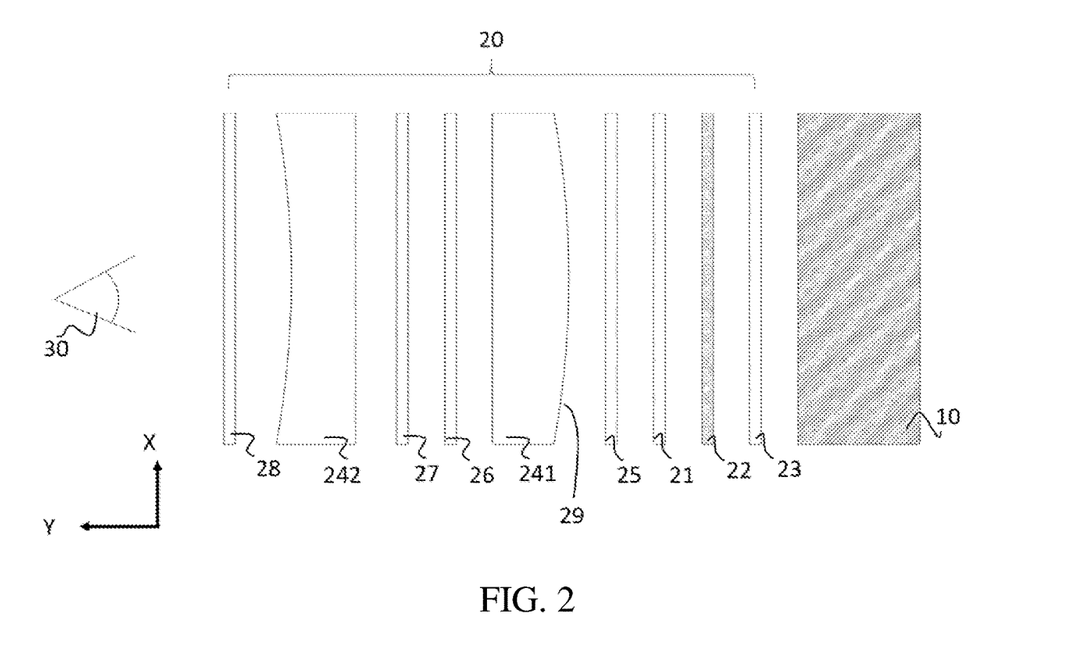
FIG. 2 is a schematic diagram of a virtual reality display device according to a first embodiment of the present disclosure.

FIG. 2 is a schematic diagram of a virtual reality display device according to the first embodiment of the present disclosure. As shown in the figure, the virtual reality display device includes an OLED (Organic Light-Emitting Diode) display panel 10 and an optical system 20. The optical system 20 is disposed between the OLED display panel 10 and a user viewing side 30. The OLED display panel 10 is configured to generate an image. Light emitted by the OLED display panel 10 is different from light emitted by a liquid crystal display device. The light emitted by the liquid crystal display device is polarized light, and the light emitted by the OLED display panel is close to natural light. The optical system 20 is configured to pull a near image generated by the OLED display panel 10 to a far distance and enlarge it to make it almost fill a human's vision field, resulting in immersion. The optical system 20 is a polarization folding optical system, and it is necessary to first polarize the natural light generated by the OLED display panel 10 and then execute subsequent processing. The optical system 20 includes a first linear polarizing sheet 21 disposed between the OLED display panel 10 and the user viewing side 30, a lens system disposed between the first linear polarizing sheet 21 and the user viewing side 30, a first reflective-transmissive optical film 22 disposed between the first linear polarizing sheet 21 and the OLED display panel 10, and a first quarter-wave plate 23 disposed between the first reflective-transmissive optical film 22 and the OLED display panel 10.

Figure 3:
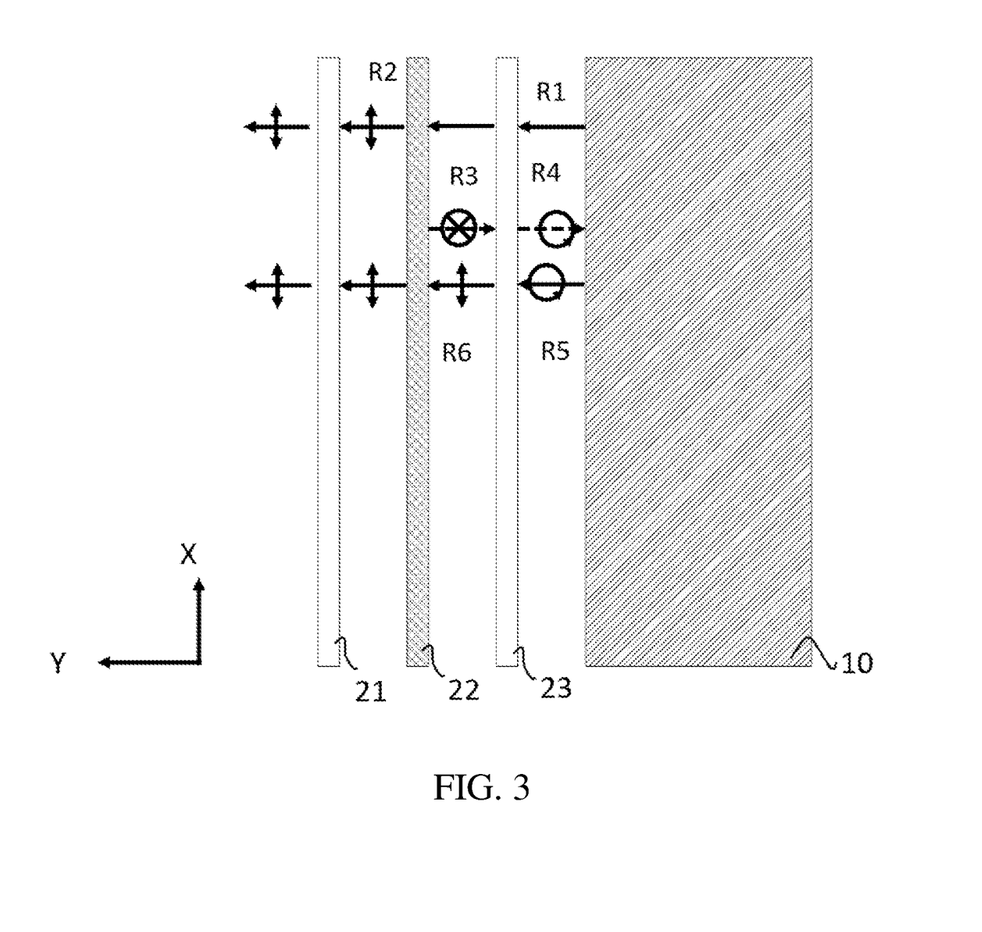
FIG. 3 is an optical path diagram from an OLED display panel to a first linear polarizing sheet in the embodiment shown in FIG. 2.

Referring to FIG. 3, an optical path diagram from the OLED display panel to the first linear polarizing sheet is shown. Light R1 emitted from the OLED display panel 10 is natural light. The light R1 passes through the first quarter-wave plate 23 and the first reflective-transmissive optical film 22. The first reflective-transmissive optical film 22 functions to transmit polarized light in one vibration direction and reflect polarized light in a direction that is orthogonal to the vibration direction. The first quarter-wave plate 23 functions to convert linearly polarized light transmitted therethrough into circularly polarized light or convert circularly polarized light transmitted therethrough into linearly polarized light, and an optical axis direction of the first quarter-wave plate 23 can be at an angle of 45 degrees with respect to an X-axis. In the first embodiment, in the light emitted onto the first reflective-transmissive optical film 22, P-type polarized light R2 can be transmitted, and S-type polarized light R3 is reflected by the first reflective-transmissive optical film 22. The P-type polarized light R2 then propagates towards the first linear polarizing sheet 21. The first linear polarizing sheet 21 can be a linear polarizing sheet that allows the P-type polarized light to be transmitted. A light transmission axis of the first linear polarizing sheet 21 can be parallel to the X axis. Therefore, after the P-type polarized light R2 in the light R1 is transmitted through the first reflective-transmissive optical film 22, it is transmitted through the first linear polarizing sheet 21 and then enters a lens system to finally reach the user viewing side 30, creating immersion in a virtual reality.

After the S-type polarized light R3 in the light R1 is reflected by the first reflective-transmissive optical film 22, it passes through the first quarter-wave plate 23 and is converted into left-handed polarized light R4. The left-handed polarized light R4 is reflected by the OLED display panel 10 to be turned into right-handed polarized light R5. The right-handed polarized light R5 passes through the first quarter-wave plate 23 and then is changed into P-type polarized light R6. The P-type polarized light R6 can pass through the first reflective-transmissive optical film 22 and the first linear polarizing sheet 21, then enters the lens system and eventually reaches the user viewing side 30, creating immersion in the virtual reality. If the first reflective-transmissive optical film 22 and the first quarter-wave plate 23 are not provided, only the P-type polarized light R2 in the light R1 can pass through the first linear polarizing sheet 21, whereas the S-type polarized light R3 cannot enter the subsequent optical system, which causes optical loss and leads to low display brightness of the virtual reality display device. In the present disclosure, by providing the first reflective-transmissive optical film 22 and the first quarter-wave plate 23, the S-type polarized light R3 is converted into the P-type polarized light R6 and it enters the subsequent optical system, thereby improving an optical utilization rate of the virtual reality display device and also improving the display brightness of the virtual reality display device. In other implementations, the first reflective-transmissive optical film can be a reflective polarizing sheet that transmits the S-type polarized light and reflects the P-type polarized light, and the first linear polarizing sheet can be a linear polarizing sheet that transmits the S-type polarized light, such that the reflected P-type polarized light, after being reflected by the OLED display panel and then passing through the first quarter-wave plate, is converted into the S-type polarized light by the first quarter-wave plate, and then it can be utilized by the optical system to increase the display brightness of the virtual reality display device.

In an embodiment, referring to FIG. 2, in the virtual reality display device provided by the first embodiment of the present disclosure, the optical system includes one plano-convex lens 241 and one plano-concave lens 242. The plano-convex lens 241 is located at a side close to the first linear polarizing sheet 21, and the plano-concave lens 242 is close to a side of the user viewing side 30. A second quarter-wave plate 25 is disposed between the first linear polarizing sheet 21 and the plano-convex lens 241. A third quarter-wave plate 26 and a second reflective-transmissive optical film 27 are disposed between the plano-convex lens 241 and the plano-concave lens 242. A semi-transmissive and semi-reflective film layer 29 is plated on a side of the plano-convex lens 241 close to the second quarter-wave plate 25.

Figure 4:
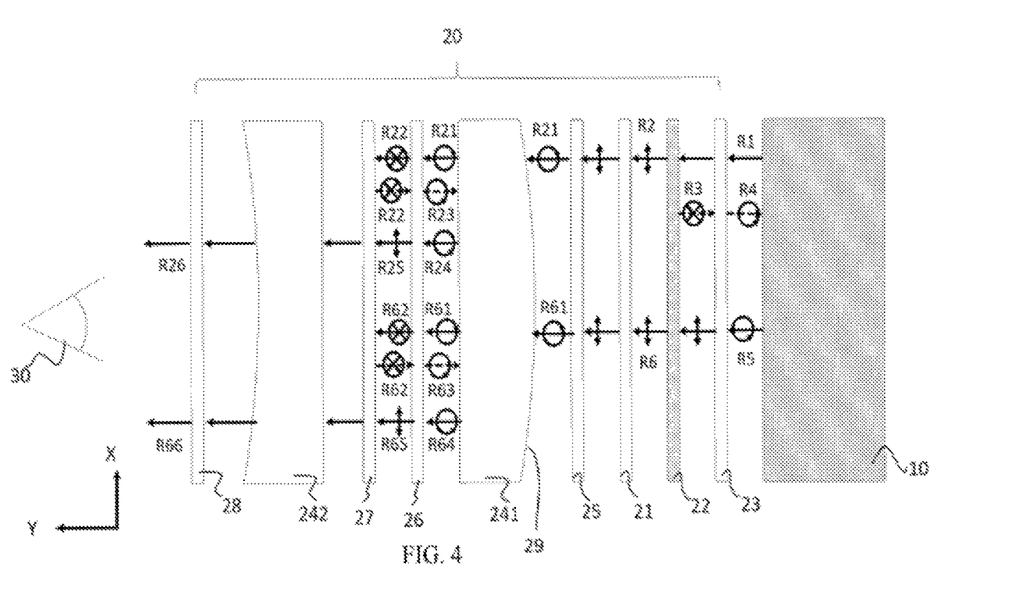
FIG. 4 is an optical path diagram of a virtual reality display device provided by the embodiment shown in FIG. 2.

Referring to FIG. 4, an optical path diagram of a virtual reality display device according to the first embodiment of the present disclosure is illustrated. As shown in the figure, the light R2 is still a linearly polarized light after passing through the first linear polarizing sheet 21, and it then passes through the second quarter-wave plate 25 and is changed into circularly polarized light R21. The circularly polarized light R21 passes through the plano-convex lens 241 and the third quarter-wave plate 26 and then is changed into linearly polarized light R22, the linearly polarized light R22 being still P-type polarized light. The second reflective-transmissive optical film 27 is a reflective polarizing sheet that transmits S-type polarized light and reflects P-type polarized light, so the P-type polarized light R22 cannot be transmitted through the second reflective-transmissive optical film 27 and is reflected back to the third quarter-wave plate 26. The P-type polarized light R22 is transmitted through the third quarter-wave plate 26 to be converted into circularly polarized light R23, and the circularly polarized light R23 is left-handed polarized light. Because the side of the plano-convex lens 241 close to the second quarter-wave plate 25 is plated with the semi-transmissive and semi-reflective film layer 29, part of the left-handed polarized light R23 is reflected to form right-handed polarized light R24. The right-handed polarized light R24 is transmitted through the third quarter-wave plate 26 to be changed into linearly polarized light R25. The linearly polarized light R25 is S-type polarized light and can be transmitted through the second reflective-transmissive optical film 27. The linearly polarized light R25 is transmitted through the second reflective-transmissive optical film 27 and then transmitted through the plano-concave lens 242, to reach the user viewing side 30.

In an embodiment, a second linear polarizing sheet 28 is further disposed between the user viewing side 30 and the plano-concave lens 242. The second linear polarizing sheet 28 can filter out a small amount of linearly polarized light, of which a polarization direction is different from a transmission axis of the second linear polarizing sheet 28, in the linearly polarized light R25, such that the light reaching the user viewing side 30 are all linearly polarized light of which a direction is the same as the transmission axis of the second linear polarizing sheet 28, thereby improving display effect.

Similarly, the light R6 is still linearly polarized light after passing through the first linear polarizing sheet 21, and it then passes through the second quarter-wave plate 25 and is changed into a circularly polarized light R61. The circularly polarized light R61 passes through the plano-convex lens 241 and the third quarter-wave plate 26 and then is changed into linearly polarized light R62, the linearly polarized light R62 being still P-type polarized light. The second reflective-transmissive optical film 27 is a reflective polarizing sheet that transmits S-type polarized light and reflects P-type polarized light, so the P-type polarized light R62 cannot be transmitted through the second reflective-transmissive optical film 27 and reflected back to the third quarter-wave plate 26. The P-type polarized light R62 is transmitted through the third quarter-wave plate 26 to be converted into circularly polarized light R63, and the circularly polarized light R63 is left-handed polarized light. Because the semi-transmissive and semi-reflective film layer 29 is plated on the side of the plano-convex lens 241 close to the second quarter-wave plate 25, part of the left-handed polarized light R63 is reflected to form right-handed polarized light R64. The right-handed polarized light R64 is transmitted through the third quarter-wave plate 26 and then is changed into linearly polarized light R65. The linearly polarized light R65 is S-type polarized light and can be transmitted through the second reflective-transmissive optical film 27. The linearly polarized light R65 is transmitted through the second reflective-transmissive optical film 27, then transmitted through the plano-concave lens 242, and then transmitted through the second linear polarizing sheet 28. The second linear polarizing sheet 28 can filter out a small amount of linearly polarized light, of which a polarization direction is different from the transmission axis of the second linear polarizing sheet 28, in the linearly polarized light R65. Thus, the light R3, which cannot be transmitted through the first linear polarizing sheet originally, is converted, via the first reflective-transmissive optical film and the first quarter-wave plate that are disposed between the first linear polarizing sheet and the OLED display device, into the light R6 that can be transmitted through the first linear polarizing sheet, and then it enters the subsequent light system and is utilized, which improves the optical utilization rate and brightness of the entire virtual reality display device.

The specific optical system 20 of the entire virtual reality display device shown in FIG. 2 is only one implementation provided by the present disclosure. As long as the first reflective-transmissive optical film and the first quarter-wave plate are disposed between the first linear polarizing sheet and the OLED display panel in the optical system, the optical utilization rate can be improved, and the optical system following the first linear polarizing sheet can be any optical system.

Figure 5:
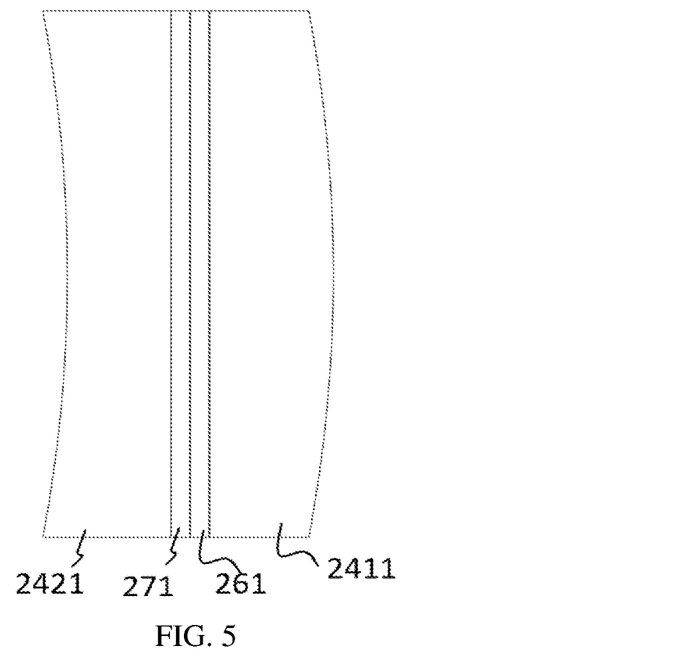
FIG. 5 is a schematic diagram of a lens system in a virtual reality display device according to another implementation of the first embodiment.
Figure 6:
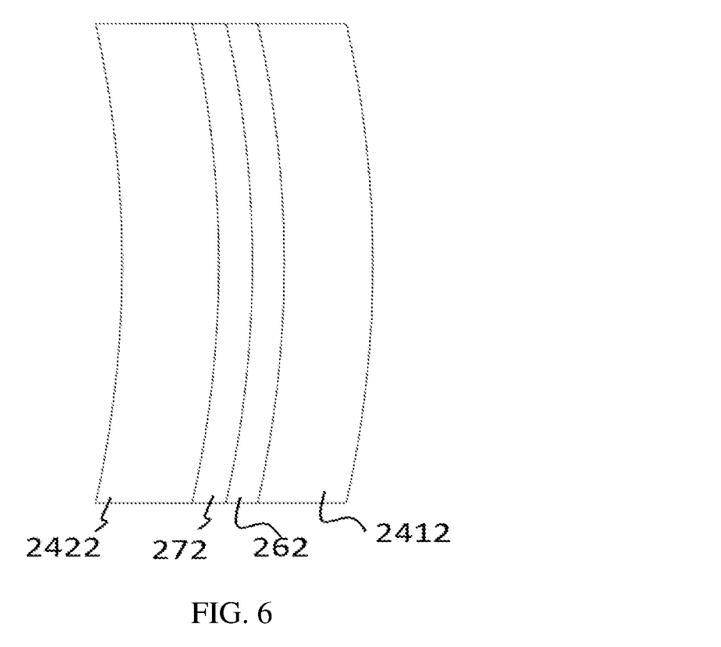
FIG. 6 is a schematic diagram of a lens system in a virtual reality display device according to still another implementation of the first embodiment.

FIG. 5 is a schematic diagram of an optical system in a virtual reality display device according to another implementation of the first embodiment of the present disclosure. As shown in the figure, being different from the structure shown in FIG. 2 where an air layer is provided between any two of the plano-convex lens 241, the third quarter-wave plate 26, the second reflective-transmissive optical film 27 and the plano-concave lens 242, in a structure shown in FIG. 5, a plano-convex lens 2411, the third quarter-wave plate 261, the second reflective-transmissive optical film 271, and a plano-concave lens 2421 are all closely fitted to each other, preventing loss of light due to propagating in the air layer. FIG. 6 is a schematic diagram of an optical system in a virtual reality display device according to still another implementation of the first embodiment. As shown in the figure, the plano-convex lens 2412 and the plano-concave lens 2422 are both formed with corresponding curved structures, and the third quarter-wave plate 262 and the second reflective-transmissive optical film 272 that are located between them are also assembled, in a curved shape, between the plano-convex lens 2412 and the plano-concave lens 2422. The structure shown in FIG. 6 can eliminate the air layer, reduce a thickness of the optical system, and also reduce the loss of light due to propagating in the light system. By providing the plano-convex lens and the plano-concave lens with the corresponding curved structures, a size of the light system is reduced, and a more compact virtual reality display device is provided.

In an embodiment, the first reflective-transmissive optical film can be a reflective polarizing sheet or a metal grating polarizer. Both the reflective polarizing sheet and the metal grating polarizer can transmit polarized light in one polarization direction and reflects polarized light in other polarization directions. Similarly, the second reflective-transmissive optical film can also be a reflective polarizing sheet or a metal grating polarizer.

Second Embodiment

Figure 7:
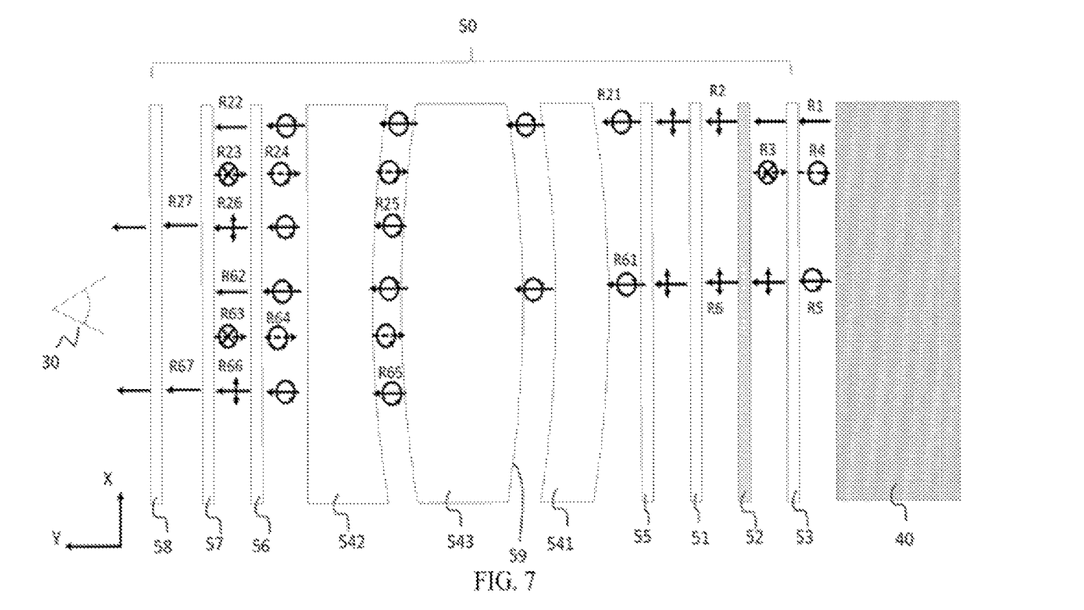
FIG. 7 is a schematic diagram of a virtual reality display device according to a second embodiment of the present disclosure.

FIG. 7 is a schematic diagram of a virtual reality display device according to a second embodiment of the present disclosure. As shown in the figure, the virtual reality display device includes an OLED display panel 40 and an optical system 50. The optical system 50 is disposed between the OLED display panel 40 and a user viewing side 30. The OLED display panel 40 is configured to generate an image. Light emitted by the OLED display panel 40 is close to natural light. The optical system 50 is configured to pull a near image generated by the OLED display panel 40 to a far distance and enlarge it to make it almost fill a human's vision field, resulting in immersion. The optical system 50 is a polarization folding optical system, and it is necessary to first polarize the natural light generated by the OLED display panel 40 and then execute subsequent processing. The optical system 50 includes a first linear polarizing sheet 51 disposed between the OLED display panel 40 and the user viewing side 30, a lens system disposed between the first linear polarizing sheet 51 and the user viewing side 30, a first reflective-transmissive optical film 52 disposed between the first linear polarizing sheet 51 and the OLED display panel 40, and a first quarter-wave plate 53 disposed between the first reflective-transmissive optical film 52 and the OLED display panel 40.

Referring to FIG. 7, an optical path diagram of light emitted by the OLED display panel 40 is illustrated. Same as the first embodiment, the virtual reality display device provided by the second embodiment can convert the light, of which a polarization direction is different from an axis direction of the first linear polarizing sheet 51, in the light emitted by the OLED display panel 40 and then use it. The light R1 emitted from the OLED display panel 40 is natural light. The light R1 passes through the first quarter-wave plate 53 and the first reflective-transmissive optical film 52. The first reflective-transmissive optical film 52 functions to transmit polarized light in one vibration direction and reflect polarized light in a direction that is orthogonal to the vibration direction. The first quarter-wave plate 53 functions to convert linearly polarized light transmitted therethrough into circularly polarized light or convert circularly polarized light transmitted therethrough into linearly polarized light, and an optical axis direction of the first quarter-wave plate 53 can be at an angle of 45 degrees with respect to an X-axis. In the second embodiment, in the light emitted onto the first reflective-transmissive optical film 52, P-type polarized light R2 can be transmitted, and S-type polarized light R3 is reflected by the first reflective-transmissive optical film 52. After the S-type polarized light R3 is reflected by the first reflective-transmissive optical film 52, it passes through the first quarter-wave plate 53 and is converted into left-handed polarized light R4. The left-handed polarized light R4 is reflected by the OLED display panel 40 to be turned into right-handed polarized light R5. The right-handed polarized light R5 passes through the first quarter-wave plate 53 and then is changed into P-type polarized light R6. The P-type polarized light R6 can pass through the first reflective-transmissive optical film 52 and the first linear polarizing sheet 51, then enters the lens system and eventually reaches the user viewing side 30, creating immersion in the virtual reality.

Referring to FIG. 7, further, in the virtual reality display device provided by the second embodiment of the present disclosure, the lens system includes one plano-convex lens 541, one biconvex lens 543, and one plano-concave lens 542. The plano-convex lens 541 is located at a side close to the first linear polarizing sheet 51, and the plano-concave lens 542 is close to the user viewing side 30. The biconvex lens 543 is located between the plano-convex lens 541 and the plano-concave lens 542. A second quarter-wave plate 55 is disposed between the first linear polarizing sheet 51 and the plano-convex lens 541. A third quarter-wave plate 56 and a second reflective-transmissive optical film 57 are disposed between the plano-concave lens 542 and the user viewing side 30. A semi-transmissive and semi-reflective film layer 59 is plated at a side of the biconvex lens 543 close to the second quarter-wave plate 55.

As shown in the figure, the P-type polarized light R2 is still P-type polarized light after passing through the first linear polarizing sheet 51, and then it passes through the second quarter-wave plate 55 and is changed into circularly polarized light R21. The circularly polarized light R21 is still circularly polarized light R21 after passing through the plano-convex lens 541, the biconvex lens 543 and the plano-concave lens 542. The circularly polarized light R21 is changed into linearly polarized light R22 after passing through the third quarter-wave plate 56. Since the P-type polarized light R2 consecutively passes through the two quarter-wave plates, it is converted into S-type polarized light. The second reflective-transmissive optical film 57 is configured to transmit P-type polarized light and reflect S-type polarized light, so the S-type polarized light R22 cannot be transmitted through the second reflective-transmissive optical film 57 and be reflected back. Reflected light R23 passes through the third quarter-wave plate 56, and the S-type polarized light R23 is transmitted through the third quarter-wave plate 56 and converted into circularly polarized light R24. The circularly polarized light R24 is left-handed polarized light. The left-handed polarized light R24 passes through the plano-concave lens 542 and is emitted towards the biconvex lens 543. Since the semi-transmissive and semi-reflective film layer 59 is plated on a side of the biconvex lens 543 facing the plano-convex lens 541, part of the left-handed polarized light R24 is reflected to form right-handed polarized light R25. The right-handed polarized light R25 is transmitted through the third quarter-wave plate 56 and then is changed into linearly polarized light R26, and the linearly polarized light R26 is P-type polarized light and can be transmitted through the second reflective-transmissive optical film 57 to form light R27 to reach the user viewing side 30.

In an embodiment, a second linear polarizing sheet 58 is further disposed between the user viewing side 30 and the second reflective-transmissive optical film 57. The second linear polarizing sheet 58 can filter out a small amount of linearly polarized light, of which a polarization direction is different from a transmission axis of the second linear polarizing sheet 58, in the linearly polarized light R27, such that the light reaching the user viewing side 30 are all linearly polarized light of which a direction is the same as the transmission axis of the second linear polarizing sheet 58, thereby improving display effect.

Similarly, the light R6 is still linearly polarized light after passing through the first linear polarizing sheet 51, and then it passes through the second quarter-wave plate 55 and is changed into circularly polarized light R61. The circularly polarized light R61 is still the circularly polarized light R61 after passing through the plano-convex lens 541, the biconvex lens 543 and the plano-concave lens 542. The circularly polarized light R61 passes through the third quarter-wave plate 56 and then is changed into linearly polarized light R62. Because the P-type polarized light R6 consecutively passes through the two quarter-wave plates, it is converted to S-type polarized light. Therefore, the S-type polarized light R62 cannot be transmitted through the second reflective-transmissive optical film 57 and is reflected back. Reflected light R63 passes through the third quarter-wave plate 56, and the S-type polarized light R63 is transmitted through the third quarter-wave plate 56 and converted into circularly polarized light R64. The circularly polarized light R64 is left-handed polarized light. The left-handed polarized light R64 passes through the plano-concave lens 542 and is emitted towards the biconvex lens 543. Since the biconvex lens 543 is plated with the semi-transmissive and semi-reflective film layer 59 on a side facing the plano-concave lens 541, part of the left-handed polarized light R64 is reflected to form right-handed polarized light R65. The right-handed polarized light R65 is transmitted through the third quarter-wave plate 56 and then is changed into linearly polarized light R66. The linearly polarized light R66 is P-type polarized light and can be transmitted through the second reflective-transmissive optical film 57 to form light R67 to reach the user viewing side 30. Thus, the light R3, which cannot be transmitted through the first linear polarizing sheet originally, is converted, via the first reflective-transmissive optical film and the first quarter-wave plate that are disposed between the first linear polarizing sheet and the OLED display panel, into the light R6 that can be transmitted through the first linear polarizing sheet, and then it enters the subsequent light system and is utilized, which improves the optical utilization rate and brightness of the entire virtual reality display device.

The linearly polarized light R66 is transmitted through the second reflective-transmissive optical film 57 and then transmitted through the second linear polarizing sheet 58. The second linear polarizing sheet 58 can filter out a small amount of linearly polarized light, of which a polarization direction is different from a transmission axis of the second linear polarizing sheet 58, in the linearly polarized light R67, such that the light reaching the user viewing side 30 are all linearly polarized light of which a direction is the same as the transmission axis of the second linear polarizing sheet 58.

In an embodiment, the first reflective-transmissive optical film can be a reflective polarizing sheet or a metal grating polarizer. Both the reflective polarizing sheet and the metal grating polarizer can transmit polarized light in one polarization direction and reflects polarized light in other polarization directions. Similarly, the second reflective-transmissive optical film can also be a reflective polarizing sheet or a metal grating polarizer.

The virtual reality display device provided by the second embodiment includes three optical lenses, and comparing with the structure in which the optical system includes two optical lenses in the first embodiment, it has advantages of eliminating an image aberration and improving an image quality of an image. Optionally, the lens system can also include two or more than three optical lenses, and the number of lenses used may improve the image quality.

In an embodiment, in the virtual reality display device provided by the present disclosure, the OLED display panel is an OLED on Silicon display panel. The OLED on Silicon display panel is provided with a monocrystal silicon chip fabricated with a CMOS driving circuit, as a substrate, and it can provide high resolution and high refresh rate, and it has a characteristic of small size, making it especially suitable to be used in virtual reality display devices.

The virtual reality display device provided by the present disclosure can, by providing the first reflective-transmissive optical film and the first quarter-wave plate that are disposed between the first linear polarizing sheet and the OLED display device, linearly polarized light, which cannot be transmitted through the first linear polarizing sheet originally, is converted into light that can be transmitted through the first linear polarizing sheet, improving the optical utilization rate and improving display brightness of the virtual reality display device.

Other implementations of the present disclosure can be easily thought of by those skilled in the art after referring to the specification and implementing the present disclosure. The present disclosure is intended to cover any variations, uses, or adaptations of the present disclosure, these variations, uses, or adaptations are subjected to general principles of the present disclosure and include common general knowledge or conventional techniques in the art that are not disclosed herein. The specification and embodiments are considered to be illustrative only, and the true scope and spirit of the present disclosure is pointed out by the appended claims. It should be understood that the present disclosure is not limited to the precise structures that have been described above and illustrated in the drawings, and various modifications and changes can be made without departing from the scope thereof. The scope of the present disclosure is defined only by the appended claims.

What is claimed is:

1. A virtual reality display device, comprising:
an OLED display panel; and
an optical system disposed between the OLED display panel and a user viewing side, wherein the optical system comprises:
a first linear polarizing sheet disposed between the OLED display panel and the user viewing side;
a first reflective-transmissive optical film disposed between the first linear polarizing sheet and the OLED display panel;
a first quarter-wave plate disposed between the first reflective-transmissive optical film and the OLED display panel;
a plano-convex lens located at a side close to the first linear polarizing sheet; and
a plano-concave lens is close to the user viewing side;
wherein the virtual reality display device further comprises a second quarter-wave plate disposed between the first linear polarizing sheet and the plano-convex lens; and
wherein from a direction from the OLED display panel to the user viewing side, the OLED display panel, the first linear polarizing sheet, the second quarter-wave plate, and the plano-convex lens are arranged sequentially.

2. The virtual reality display device according to claim 1, further comprising a third quarter-wave plate and a second reflective-transmissive optical film that are disposed between the plano-convex lens and the plano-concave lens.

3. The virtual reality display device according to claim 2, further comprising a semi-transmissive and semi-reflective film layer provided at a side of the plano-convex lens close to the second quarter-wave plate.

4. The virtual reality display device according to claim 1, further comprising a second linear polarizing sheet disposed between the plano-concave lens and the user viewing side.

5. A virtual reality display device, comprising:
an OLED display panel; and
an optical system disposed between the OLED display panel and a user viewing side, wherein the optical system comprises:
a first linear polarizing sheet disposed between the OLED display panel and the user viewing side;
a first reflective-transmissive optical film disposed between the first linear polarizing sheet and the OLED display panel; and
a first quarter-wave plate disposed between the first reflective-transmissive optical film and the OLED display panel; and
wherein the optical system comprises a plano-convex lens, a biconvex lens and a plano-concave lens, the plano-convex lens is located at a side close to the first linear polarizing sheet, the plano-concave lens is close to the user viewing side, and the biconvex lens is located between the plano-convex lens and the plano-concave lens.

6. The virtual reality display device according to claim 5, further comprising a second quarter-wave plate disposed between the plano-convex lens and the first linear polarizing sheet.

7. The virtual reality display device according to claim 6, further comprising a third quarter-wave plate and a second reflective-transmissive optical film that are disposed between the plano-concave lens and the user viewing side.

8. The virtual reality display device according to claim 7, further comprising a second linear polarizing sheet disposed between the second reflective-transmissive optical film and the user viewing side.

9. The virtual reality display device according to claim 7, further comprising a semi-transmissive and semi-reflective film layer disposed at a side of the plano-convex lens close to the second quarter-wave plate.

10. The virtual reality display device according to claim 1, wherein in natural light emitted by the OLED display panel, P-type polarized light is transmitted through the first reflective-transmissive optical film, and S-type polarized light is reflected by the first reflective-transmissive optical film to pass through the first quarter-wave plate and is reflected by the OLED display panel to be changed into P-type polarized light.

11. The virtual reality display device according to claim 1, wherein the OLED display panel is an OLED on silicon display panel.

12. The virtual reality display device according to claim 1, wherein the first reflective-transmissive optical film is a reflective polarizing sheet or a metal grating polarizer.

13. The virtual reality display device according to claim 3, further comprising:
a second linear polarizing sheet provided at a side of the plano-convex lens close to the second quarter-wave plate;
a third quarter-wave plate;
a second reflective-transmissive optical film; and
a second linear polarizing sheet,
wherein the first quarter-wave plate, the first reflective-transmissive optical film, the first linear polarizing sheet, the second quarter-wave plate, the plano-convex lens, the third quarter-wave plate, the second reflective-transmissive optical film, the plano-concave lens, and the second linear polarizing sheet that are sequentially disposed between the OLED display panel and the user viewing side.

14. The virtual reality display device according to claim 13, wherein in natural light emitted by the OLED display panel, P-type polarized light is transmitted through the first reflective-transmissive optical film, and S-type polarized light is reflected by the first reflective-transmissive optical film to pass through the first quarter-wave plate and is reflected by the OLED display panel to be changed into P-type polarized light.

15. A virtual reality display device, comprising:
an OLED display panel; and
an optical system disposed between the OLED display panel and a user viewing side,
wherein the optical system comprises a first quarter-wave plate, a first reflective-transmissive optical film, a first linear polarizing sheet, a second quarter-wave plate, a plano-convex lens, a biconvex lens position, a plano-concave lens, a third quarter-wave plate, a second reflective-transmissive optical film, and a second linear polarizing sheet that are sequentially disposed between the OLED display panel and the user viewing side, and a semi-transmissive and semi-reflective film layer is provided at a side of the biconvex lens close to the plano-convex lens.

16. The virtual reality display device according to claim 15, wherein in natural light emitted by the OLED display panel, P-type polarized light is transmitted through the first reflective-transmissive optical film, and S-type polarized light is reflected by the first reflective-transmissive optical film to pass through the first quarter-wave plate and is reflected by the OLED display panel to be changed into P-type polarized light.

\* \* \* \* \*